(12) United States Patent
Otoma

(10) Patent No.: US 7,154,927 B2
(45) Date of Patent: Dec. 26, 2006

(54) SURFACE EMITTING SEMICONDUCTOR LASER AND COMMUNICATION SYSTEM USING THE SAME

(75) Inventor: Hiromi Otoma, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 87 days.

(21) Appl. No.: 10/826,354

(22) Filed: Apr. 19, 2004

(65) Prior Publication Data

US 2004/0213310 A1 Oct. 28, 2004

(30) Foreign Application Priority Data

Apr. 25, 2003 (JP) ............... 2003-122697

(51) Int. Cl.
*H01S 5/00* (2006.01)
*H01S 3/08* (2006.01)

(52) U.S. Cl. ............... 372/45; 372/96; 372/45; 257/96

(58) Field of Classification Search ............... 372/45, 372/96; 257/96, 79, 101–103, 25, 87, 13
See application file for complete search history.

(56) References Cited

U.S. PATENT DOCUMENTS 6,765,232 B1 * 7/2004 Takahashi et al. ............ 257/79
2005/0040413 A1 * 2/2005 Takahashi et al. ............ 257/96

FOREIGN PATENT DOCUMENTS

JP        A 2002-185079        6/2002

OTHER PUBLICATIONS

Kenichi IGA; "Surface Emitting Laser"; IEICE Transactions C-1, vol. J81-C-1, No. 9; Sep. 1998; pp. 483-493.
H. Otoma et al.; "Fabrication and Performance of 12×12 Matrix-Addressed 780nm Oxide-Confined Vcsel Array"; Bulletin of Solid State Physics and Applications; vol. 5, No. 1.; 1999; pp. 11-15.
Nobuaki Ueki et al.; "Single-Transverse-Mode 3.4-mW Emission of Oxide-confined 780-nm Vesel's"; IEEE Photonics Technology Letters; vol. 11, No. 12; Dec. 1999; pp. 1539-1541.
Jun Sakurai et al.; "10 Gb/s Surface Emission Semiconductor Laser"; Electronic Materials, vol. 41, No. 11; Nov. 2002; pp. 49-52.
M. Grabherr et al.; "Efficient Single-Mode Oxide-Confined GaAs VCSEL's Emitting in the 850-nm Wavelength Regime"; IEEE Photonics Technology Letters; vol. 9, No. 10, ; Oct. 1997; pp. 1304-1306.
Aaron et al.; "Aperture Placement Effects in Oxide-Defined Vertical-Cavity Surface-Emitting Lasers"; IEEE Photonics Technology Letters; vol. 10, No. 10; Oct. 1998; pp. 1362-1364.

* cited by examiner

*Primary Examiner*—Tho Phan
*Assistant Examiner*—Chuc Tran
(74) *Attorney, Agent, or Firm*—Oliff & Berridge, PLC

(57) ABSTRACT

A surface emitting semiconductor laser includes: a semiconductor substrate; a first semiconductor multilayer reflection film of a first conduction type on the semiconductor substrate; a second semiconductor multilayer reflection film of a second conduction type; an active region and a current confining layer interposed between the first and second semiconductor multilayer reflection films; and a low-resistance layer interposed between the current confining layer and the active region.

22 Claims, 8 Drawing Sheets

SURFACE EMITTING SEMICONDUCTOR LASER AND COMMUNICATION SYSTEM USING THE SAME

BACKGROUND OF THE INVENTION

1. Field of the Invention

The present invention relates to a surface emitting semiconductor laser suitably used for optical interconnections and optical information processing, and more particularly, to a structure directed to reducing the resistance of the surface emitting semiconductor laser.

2. Description of the Related Art

Recently, large-capacity, high-speed optical communications networks such as WDM (Wavelength Division Multiplexing) have rapidly been equipped along with an increased capacity and a wider band in data communications. High-speed, parallel-processing optical communication techniques have infiltrated even in short-distance communications such as Gigabit Ethernet or data links. In the twenty-first century in which optical communications support the social infrastructure, optical devices would play a more important role. Nowadays, semiconductor lasers are embedded, as optical sources, in equipment involved in optical communications, DVD players, CD players and laser printing machines.

These semiconductor lasers are of a type in which laser light is emitted from the cleaved edge of the semiconductor substrate. This type of laser is called edge-emission laser. In contrast, there is another type of laser called vertical cavity surface emitting laser diode (VCSEL) that has a resonator arranged vertical to the surface of the semiconductor substrate and emits laser light from the semiconductor surface. VCSEL has a light emission aperture formed on the wafer surface by photolithography, which is one of the conventional semiconductor processes. Thus, VCSEL easily realizes a two-dimensional array and a large-scale device, which cannot be accomplished by the edge-emission type. In addition, VCSEL has a small volume of the active layer, so that it needs a small drive current and consumes a small amount of power. Further, VCSEL can be driven fast and needs a compact optical system because it has a complete round beam profile. These features are not provided by the edge-emission laser. Furthermore, VCSEL has some advantages in the fabrication process. For instance, VCSEL can be tested on the wafer and does not need the cleaved edges, on the device, this improving the yield.

Pioneering research of VCSEL was done by, for example, K. Iga (see K. Iga, "SURFACE EMITTING LASER", IEICE Transactions C-1, 1998 September, Vol. J81-C-1, No. 9, p.483–493. FIG. 9 shows a recent structure of VCSEL, which has a resonator 602 formed in the direction vertical to the horizontal surface of a semiconductor substrate 601. The resonator 602 has an active layer 603, a lower reflection mirror 604, an upper reflection mirror 605, and a spacer layer 606. The active layer 603 confines carriers and creates light. Each of the mirrors 604 and 605 is formed by a respective laminate of semiconductor layers. The spacer layer 606 matches the phase emitted from the active layer 603 at ends of the reflection mirrors 604 and 605. An upper contact layer 607 is defined as a part of the upper reflection mirror 604. An upper electrode 608 is provided on an interlayer insulation film 610 having a portion provided on the upper contact layer 607. The upper electrode 608 has a laser emission aperture 611. A lower electrode 609 is provided on the back surface of the semiconductor substrate 601.

An oxidization method is the main stream approach for fabricating the current confinement function in VCSEL. The oxide-confined VCSEL has a mesa structure formed by dry etching the laminate of semiconductor layers on the semiconductor substrate 601. Then, a layer 612 that has a high Al composition ratio is steam-oxidized from the circumference of the mesa structure with moisture kept at a high temperature, this resulting in an insulation region 612A. At that time, the oxidizing time may be adjusted so that a semiconductor layer 612B that is an electrically conductive region remains in the center of the mesa and the current confining structure is defined. The current confining structure defined by the oxidized layer also functions to stabilize the transverse mode of laser light due to the difference in the refractive index between the circumferential insulation layer and the central semiconductor conduction region. The current confining layer is also referred to as oxide-confined aperture layer. As described in the following documents, the oxidization type VCSEL with the oxide-confined aperture layer has a small threshold current and a good current-light characteristic, as described in H. Otoma, "FABRICATION AND PERFORMANCE OF 12×12 MATRIX-ADDRESSED 780 nm OXIDE-CONFINED VCSEL ARRAY", Bulletin of Solid State Physics and Applications, 1999, Vol. 5, No. 1, p. 11–15, and Nobuaki Ueki, "Single-Transverse-Mode 3.4-mW Emission of Oxide-confined 780-nm VCSEL's", IEEE PHOTONICS TECHNOLOGY LETTERS, 1999 DECEMBER, Vol. 11, No. 12, p. 1539–1541.

The oxide-confined VCSEL has a much smaller volume of the active region than that of the conventional edge-emission semiconductor laser, and an index waveguide type laser, and is therefore characterized that it can operate at a rate of 10 Gb/s or higher (see J. Sakurai, "10 Gb/s Surface Emission Semiconductor Laser", Electronic Materials, 2002 November, Vol. 41, No. 11, p. 49–52. The IEEE standardized the regulations of 10 Gigabit Ethernet as new regulations of high-speed local area network (LAN) on June, 2002. Most of the regulations chose 850 nm or 1310 nm VCSEL as the optical source. This explicitly shows that high-speed performance of VCSEL is attractive. There has considerable activity in the further development of improvements in the operating speed of VCSEL in order to making sure the firm position as the optical source of the communications infrastructure.

Improvements in the operating speed of VCSEL will be achieved by reducing the volume of the active layer as much as possible and reducing the resistance and capacitance of the VCSEL device. The volume of the active layer of the oxide-confined VCSEL is defined so that the carriers (holes) are confined in the small semiconductor region in the center of the mesa due to the oxide-confined aperture. At that time, current is generated so that the holes in the periphery of the mesa gather at the center of the mesa. The in-plane resistance that the carriers receive during traveling is one of the factors that increase the device resistance. Japanese Patent Application Publication No. 2002-185079 discloses a method for reducing the in-plane component of the hole resistance by providing a layer between the current confining layer and the second electrode, in which two-dimensional carriers are created.

On the other hand, long-distance communications need a single-mode VCSEL applicable to the single-mode optical fiber. Proposals described in the following papers would be effective to secure the stable single mode and obtain satisfactory optical output: Grabherr, "Efficient Single-Mode Oxide-Confined GaAs VCSEL's Emitting in the 850-nm Wavelength Regime", IEEE PHOTONICS TECHNOLOGY LETTERS, 1997 OCTOBER, Vol. 9, No. 10, p. 1304–1306, or Aaron, "Aperture Placement Effects in Oxide-Defined Vertical-Cavity Surface-Emitting Lasers", IEEE PHOTONICS TECHNOLOGY LETTERS, 1998 OCTOBER, Vol. 10, No. 10, p. 1362–1364. According to the proposals, the current confining layer in the semiconductor multilayer is provided in the vicinity of the position at which the electric field of the standing wave of laser light is minimized (at the node).

However, the conventional VCSEL has the following drawbacks. The structure proposed by Grabherr or Aaron will now be described in more detail with reference to FIGS. 10A and 10B. FIG. 10A shows a case whether an oxide-confined aperture 705 is positioned at the loop position at which the maximum electric field of a standing wave 713 of laser light is available. FIG. 10B shows another case where the oxide-confined aperture 705 is positioned at the node position at which the minimum electric field of the standing wave 713 is available. The VCSEL devices shown in FIGS. 10A and 10B has an n-type GaAs semiconductor layer 701 doped with Si ($Nd=1\times10^{18}$ cm$^{-3}$), a distributed Bragg reflection (DBR) mirror layer 702 composed of n-type $Al_{0.3}Ga_{0.7}As$ layers and n-type $Al_{0.1}Ga_{0.9}As$ layers that are alternately laminated to a thickness of 40.5 periods, and an undoped λ $Al_{0.2}Ga_{0.8}As$ spacer layer 703 where λ denotes the film thickness and its optical thickness is equal to the wavelength of laser light. A reference numeral 704 indicates a triple quantum well $GaAs/Al_{0.15}Ga_{0.85}As$ active layer in the spacer layer, and a reference numeral 705 is an oxide-confined aperture of a p-type AlAs layer doped with Zn ($Na=7\times10^{17}$ cm$^{-3}$) formed by oxidizing the circumferential periphery. Layers 703 and 704 form an active region 750. A reference numeral 706 indicates a p-type $Al_{0.9}Ga_{0.1}As$ layer doped with Zn ($Na=7\times10^{17}$ cm$^{-3}$), and a reference numeral 707 indicates a p-type $Al_{0.3}Ga_{0.1}As$ layer doped with Zn ($Na=1.5\times10^{18}$ cm$^{-3}$). One pair of layers 706 and 707 forms one period (λ/2) of the p-type DBR layer. A reference numeral 708 indicates a DBR layer composed of p-type $Al_{0.3}Ga_{0.7}As$ layers doped with Zn ($Na=7\times10^{17}$ cm$^{-3}$) and $Al_{0.9}Ga_{0.1}$ layers that form the laminate starting from the second layer. A reference numeral 709 indicates a p-type GaAs contact layer doped with Zn ($Na=1\times10^{19}$ cm$^{-3}$), and a reference numeral 710 indicates an interlayer insulation film made of SiNx. A reference numeral 711 indicates a p-side electrode, and a reference numeral 712 indicates an n-side electrode.

In the structure shown in FIG. 10A, the undoped λ $Al_{0.2}Ga_{0.8}As$ spacer layer 703 is formed just below the oxide-confined aperture layer 705 that is the current confining layer. Since the layer 703 is undoped, it has a large resistance. In contrast, the structure shown in FIG. 10B has the p-type $Al_{0.9}Ga_{0.1}As$ layer 706 doped with Zn ($Na=7\times10^{17}$ cm$^{-3}$) that has an Al composition ratio of 90% and is located just below the oxide-confined aperture 705. Originally, the semiconductor layer that has a high Al composition ratio has a low carrier mobility and a poor carrier density due to a low p-type impurity-activated ratio, and is thus a high-resistance layer. This high-resistance layer is operatively added to the current path that is narrowed due to the current confining layer. Thus, the presence of the high-resistance layer just below the oxide-confined aperture layer 705 increases the device resistance and prevents high-speed drive. Regarding this problem, Japanese Patent Application Publication No. 2002-185079 proposes to use the carrier generating layer between the current confining layer and the upper electrode. However, the proposed layer only reduces the resistance at the position at which the carriers travel towards the current confining layer.

SUMMARY OF THE INVENTION

The present invention has been made in view of the above circumstances and provides a surface emitting semiconductor laser comprising: a semiconductor substrate; a first semiconductor multilayer reflection film of a first conduction type on the semiconductor substrate; a second semiconductor multilayer reflection film of a second conduction type; an active region and a current confining layer interposed between the first and second semiconductor multilayer reflection films; and a low-resistance layer interposed between the current confining layer and the active region.

According to another aspect of the present invention, there is provided a surface emitting semiconductor laser comprising: a semiconductor substrate; a first semiconductor multilayer reflection film of a first conduction type on the semiconductor substrate; a second semiconductor multilayer reflection film of a second conduction type; an active region disposed between the first and second semiconductor multilayer reflection films; a current confining layer in the second semiconductor multilayer reflection film; and a low-resistance layer interposed between the current confining layer and the active region.

According to yet another aspect of the present invention, there is provided a surface emitting semiconductor laser comprising: a semiconductor substrate; a first semiconductor multilayer reflection film of a first conduction type; an active region; a current confining layer formed by oxidizing a part of a high-Al-composition-ratio layer having at least single layer; a second semiconductor multilayer reflection film of a second conduction type; and a low-resistance layer provided in the vicinity of the current confining layer and comprising $Al_xGa_{1-x}As$, the second semiconductor multilayer reflection film comprising $Al_aGa_{1-a}As$ and $Al_bGa_{1-b}As$, composition ratios a, b and x meet a>x>b.

According to a further aspect of the present invention, there is provided a method of fabricating a surface emitting semiconductor laser comprising the steps of: forming a semiconductor laminate on a semiconductor substrate, the semiconductor laminate including a first semiconductor multilayer reflection film of a first conduction type, an active region, a low-resistance layer, a high-Al-composition-ratio semiconductor layer containing a high Al composition ratio, and a second semiconductor multilayer reflection film of a second conduction type; etching the semiconductor laminate so that a mesa structure is formed on the semiconductor substrate: and forming a current confining layer by oxidizing a part of the high-Al-composition-ratio layer from a side surface of the mesa structure to thus form a current confining layer.

According to a still further aspect of the present invention, there is provided a method of fabricating a surface emitting semiconductor laser comprising the steps of: forming a semiconductor laminate on a semiconductor substrate, the semiconductor laminate including a first semiconductor multilayer reflection film of a first conduction type, an active region, a high-Al-composition-ratio semiconductor layer containing a high Al composition ratio, low-resistance layers between which the high-Al-composition-ratio semiconductor layer is sandwiched, and a second semiconductor multilayer reflection film of a second conduction type; etching the semiconductor laminate so that a mesa structure is formed on the semiconductor substrate; and forming a current confining layer by oxidizing a part of the high-Alcomposition-ratio layer from a side surface of the mesa structure to thus form a current confining layer.

BRIEF DESCRIPTION OF THE DRAWINGS

Preferred embodiments of the present invention will be described in detail based on the following figures, wherein.

DESCRIPTION OF THE PREFERRED EMBODIMENTS

Figure 1:
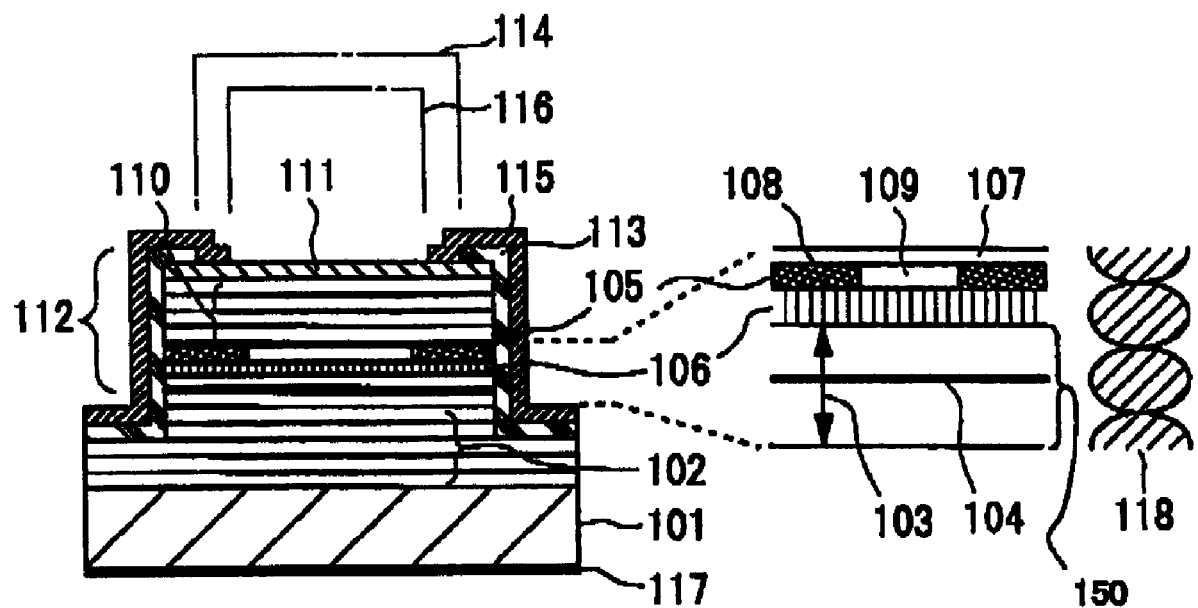
FIG. 1 shows a surface emitting semiconductor laser according to a first embodiment of the present invention.

According to one aspect of the present invention, the surface emitting semiconductor laser includes, at least a semiconductor substrate, a first DBR mirror that has a first conduction type and is formed by a laminate of semiconductor films, an active layer, a spacer layer in which the active layer is located, a current confining layer formed by oxidizing a part of a semiconductor layer that forms the laminate and has a high Al composition ratio, and a second DBR mirror that has a second conduction type and is formed by a laminate of semiconductor films. Further, the surface emitting semiconductor laser includes a low-resistance layer interposed between the current confining layer and the spacer layer. The low-resistance layer brings about an effect of reducing the high-resistance component added in the narrow current path defined by the current confining layer. The low-resistance layer may have an Al composition ratio lower than that of the Al composition ratio of a layer that forms the DBR mirror of the second conduction type (except the current confining layer). As has been described, in the conventional VCSEL, namely, VCSEL equipped with means for stabilizing the mode, one of the layers that form the DBR mirror of the second conduction type and has a high Al composition ratio is located just below the current confining layer (in contact with the surface of the active layer). This increases the device resistance. Therefore, the presence of the Al contained layer that has a comparatively low resistance increases the mobility of the semiconductor layer. Further, the reduced Al composition ratio increases the impurity-activated ratio, so that a high carrier density can be obtained even for a low impurity concentration.

The low-resistance layer is one of the layers that forms the vertical resonator of the VCSEL, and is required to have a refractive index value and a thickness that meet the condition for resonance. The refractive index mainly depends on the Al composition ratio. The thickness is determined so that the sum of the product $d1 \cdot n1$ and $d2 \cdot n2$ is equal to approximately ¼ where $d1$ and $n1$ denote the thickness and refractive index of the low-resistance layer, and $d2$ and $n2$ denote the thickness and refractive index of the central conductive region in the current confining layer. Alternatively, when the low-resistance layer is embedded in the DBR layer, the thickness is determined so that the sum of the product $d1 \cdot n1$ and $d3 \cdot n3$ is equal to approximately ¼ where $d1$ and $n1$ denote the thickness and refractive index of the low-resistance layer, and $d3$ and $n3$ denote the thickness and refractive index of one of the DBR layer adjacent to the low-resistance layer.

Even in a case where the current confining layer is not the last layer of the second DBR mirror but is an intermediate one of the layers, the same effects are obtained by changing the layer just below the current confining layer to the low-resistance semiconductor layer.

First Embodiment

FIG. 1 is a cross-sectional view of a VCSEL according to a first embodiment of the present invention. Referring to this figure, the VCSEL has an n-type GaAs semiconductor 101 doped with Si ($Nd=1\times10^{18}$ cm$^{-3}$) on which a DBR layer 102 and a spacer layer 103 are formed. The DBR layer 102 is a laminate of n-type $Al_{0.3}Ga_{0.7}As$ layers doped with Si ($Nd=1\times10^{18}$ cm$^{-3}$) and n-type $Al_{0.9}Ga_{0.1}As$ layers doped with silicon ($Nd=1\times10^{18}$ cm$^{-3}$), which layers are alternately laminated one by one to a thickness of 40.5 periods. The spacer 103 is an undoped λ $Al_{0.4}Ga_{0.6}As$ layer where λ denotes the film thickness and its optical thickness is equal to the wavelength of laser light. A triple quantum well $GaAs/Al_{0.15}Ga_{0.85}As$ layer 104 is formed within the spacer layer 103. Layers 103 and 104 form an active region 150.

A p-type $Al_{0.5}Ga_{0.5}As$ layer 106 doped with Zn ($Na=1.5\times10^{18}$ cm$^{-3}$), which is the low-resistance layer, is formed on the spacer 103. A p-type AlAs layer 105 doped with Zn ($Na=7\times10^{17}$ cm$^{-3}$) and a p-type $Al_{0.3}Ga_{0.7}As$ layer 107 doped with Zn ($Na=7\times10^{18}$ cm$^{-3}$) are formed on and above the low-resistance layer 106. One period of the p-type DBR layer is formed by the p-type $Al_{0.5}Ga_{0.5}As$ layer 106 that is the low-resistance layer, the p-type AlAs layer 105 and the p-type $Al_{0.3}Ga_{0.7}As$ layer 107, and the sum of the optical thicknesses of the three layers is preferably equal to half the wavelength λ of laser light (λ/2). In order to maintain the reflection performance of the DBR layer, preferably the sum of the optical thicknesses of the p-type AlAs layer 105 and the p-type $Al_{0.5}Ga_{0.5}As$ layer 106, or the optical thickness of the p-type $Al_{0.5}Ga_{0.5}As$ layer 106 is equal to a quarter of the wavelength λ of laser light (λ/4).

The p-type AlAs layer 105 is a current confining layer composed of an insulation region 108 formed by selectively oxidizing the circumferential periphery from the sidewall of a mesa 112, and a conductive region 109 located at the central region of the mesa 112.

A p-type DBR layer 110 is formed on the p-type $Al_{0.3}Ga_{0.7}As$ layer 107. The DBR layer 110 is a laminate of p-type $Al_{0.3}Ga_{0.7}As$ layers doped with Zn ($Na=7\times10^{17}$ cm$^{-3}$) and p-type $Al_{0.3}Ga_{0.7}As$ layers doped with Zn ($Na=1\times10^{17}$ cm$^{-3}$), which layers are alternately laminated one by one to a thickness of 20.5 periods. A p-type GaAs contact layer doped with Zn ($Na=1\times10^{19}$ cm$^{-3}$) is formed on the p-type DBR layer 110.

It is to be noted that the high-Al-composition-ratio layer in the first-period layer of the p-type DBR layer have an Al composition ratio different from that of the high-Al-composition-ratio layers in the other p-type layers starting from the second-period layer. The p-type AlAs layer 105 functions as the current confining layer and simultaneously functions to control the mode of laser light in the in-film-plane as the oxide-confined aperture because of the difference in the refractive index between the insulation region 108 and the central region of the conductive region 109.

A cylindrical structure 112 called mesa or post is formed by dry etching so that the laminate is etched beyond the active layer 104 and reaches a lower layer. In some cases, the post 112 may not go beyond the active layer 104. The post 112 is covered with an insulation film 113 made of, for example, SiNx. The insulation layer 113 has a contact hole 114, through which a p-side electrode 115 contacts a p-type contact layer 111. The p-side electrode 115 may be composed of a contact electrode that directly connects the p-type contact layer 111, and an extraction electrode that extends from the contact electrode. The p-side electrode 115 has a laser emission aperture 116 from which laser light is emitted. The aperture 116 is located in the central part of the post 112. An n-side electrode 117, which may be made of a metal such as AuGeNi, is formed below the n-type GaAs substrate 101. A reference numeral 118 schematically depicts the standing wave of laser light The current confining layer 105 is located at the node position at which the maximum electric field of the standing wave 118 of laser light is available.

Second Embodiment

Figure 2:
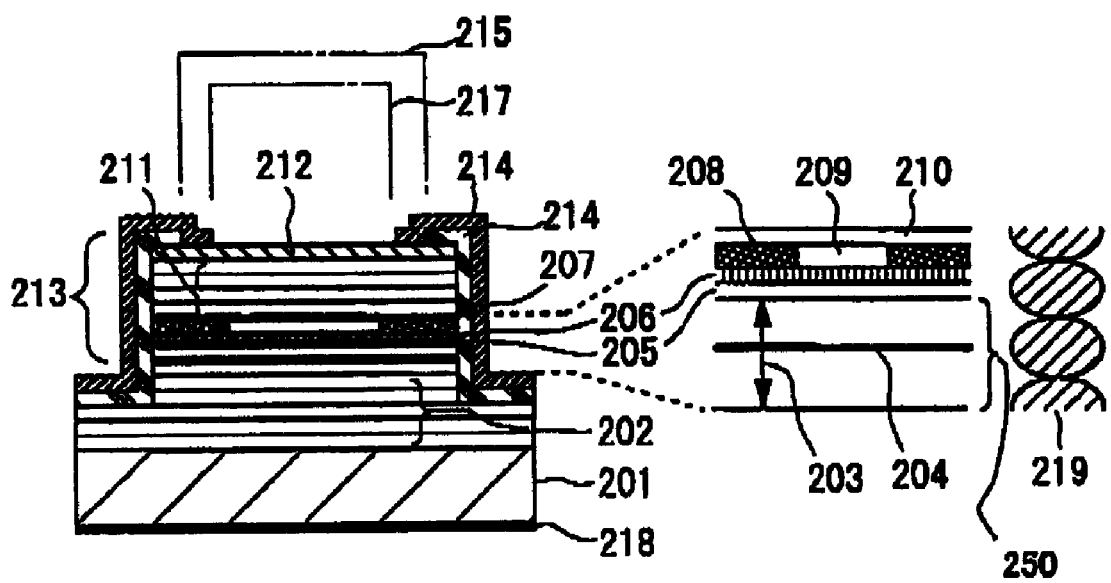
FIG. 2 shows a surface emitting semiconductor laser according to a second embodiment of the present invention.

FIG. 2 shows a VCSEL according to a second embodiment of the present invention. Referring to this figure, the VCSEL has an n-type GaAs semiconductor 201 doped with Si ($Nd=1\times10^{18}$ $cm^{-3}$) on which an n-type DBR layer 202 and a spacer layer 203 are formed. The DBR layer 202 is a laminate of n-type $Al_{0.3}Ga_{0.7}As$ layers doped with Si ($Nd=1\times10^{18}$ $cm^{-3}$) and n-type $Al_{0.9}Ga_{0.1}As$ layers doped with silicon ($Nd=1\times10^{18}$ $cm^{-3}$), which layers are alternately laminated one by one to a thickness of 40.5 periods. The spacer 203 is an undoped $\lambda$ $Al_{0.4}Ga_{0.6}As$ layer where $\lambda$ denotes the film thickness and its optical thickness is equal to the wavelength of laser light. A triple quantum well GaAs/$Al_{0.15}Ga_{0.85}As$ layer 204 is formed within the spacer layer 203. Layers 203 and 204 form an active region 250. On the spacer layer 203, there are provided a p-type $Al_{0.9}Ga_{0.1}As$ layer 205 that is doped with Zn ($Na=7\times10^{17}$ $cm^{-3}$) and is $\lambda/8$ thick, and a p-type $Al_{0.5}Ga_{0.5}As$ layer 206 that is doped with Zn ($Na=1.5\times10^{18}$ $cm^{-3}$) and is $\lambda/8$ thick. The layer 206 is a low-resistance layer. On the p-type $Al_{0.5}Ga_{0.5}As$ layer 206, there is provided a p-type AlAs layer 207 ($Na=1\times10^{18}$ $cm^{-3}$), on which a p-type $Al_{0.3}Ga_{0.7}As$ layer 210 doped with Zn ($Na=1\times10^{18}$ $cm^{-3}$). The four layers of the p-type $Al_{0.9}Ga_{0.1}As$ layer 205, p-type $Al_{0.5}Ga_{0.5}As$ layer 206, p-type AlAs layer 207, and p-type $Al_{0.3}Ga_{0.7}As$ layer 210 form one period of the p-type DBR layer. The sum of the optical thicknesses of the four layers is preferably equal to half the wavelength $\lambda$ of laser light ($\lambda/2$). In order to maintain the reflection performance of the DBR layer, preferably, the sum of the optical thicknesses of the p-type AlAs layer 207 and the p-type $Al_{0.5}Ga_{0.5}As$ layer 206, or the optical thickness of the p-type $Al_{0.5}Ga_{0.5}As$ layer 206 is equal to a quarter of the wavelength $\lambda$ of laser light ($\lambda/4$).

The p-type AlAs layer 207 is a current confining layer composed of an insulation region 208 formed by selectively oxidizing the circumferential periphery from the sidewall of the mesa, and a conductive region 209 located at the central region of the mesa. A p-type DBR layer 211 is formed on the p-type $Al_{0.3}Ga_{0.7}As$ layer 210. The DBR layer 211 is a laminate of p-type $Al_{0.9}Ga_{0.1}As$ layers doped with Zn ($Na=7\times10^{17}$ $cm^{-3}$) and p-type $Al_{0.3}Ga_{0.7}As$ layers doped with Zn ($Na=7\times10^{17}$ $cm^{-3}$), which layers are alternately laminated one by one to a thickness of 20.5 periods. A p-type GaAs contact layer 212 doped with Zn ($Na=1\times10^{19}$ $cm^{-3}$) is formed on the p-type DBR layer 211.

The p-type AlAs layer 207 functions as the current confining layer and simultaneously functions to control the mode of laser light in the in-film-plane as the oxide-confined aperture because of the difference in the refractive index between the insulation region 208 and the central region of the conductive region 209.

A cylindrical structure 213 called mesa or post is formed by dry etching so that the laminate is etched beyond the active layer 204 and reaches a lower layer. The post 213 is covered with an insulation film 214 made of, for example, SiNx. The insulation layer 214 has a contact hole 215, through which a p-side electrode 216 contacts a p-type contact layer 212. The p-side electrode 216 may be composed of a contact electrode that directly connects the p-type contact layer 212, and an extraction electrode that extends from the contact electrode. The p-side electrode 216 has a laser emission aperture 217 from which laser light is emitted. The aperture 217 is located in the central part of the post 213. An n-side electrode 218, which may be made of a metal such as AuGeNi, is formed below the n-type GaAs substrate 201. A reference numeral 219 schematically depicts the standing wave of laser light. The current confining layer 207 is located at the node position at which the maximum electric field of the standing wave 219 of laser light is available.

It is to be noted that a laminate, which is composed of the p-type $Al_{0.9}Ga_{0.1}As$ layer 205 having an Al composition ratio higher than that of the spacer layer 203 and the low-resistance layer 206 having a lower Al composition ratio, is interposed between the spacer layer 203 and the current confining layer 207. It is possible to prevent the reflectance from being degraded and maintain the resonator performance by interposing the p-type $Al_{0.9}Ga_{0.1}As$ layer 205 between the low-resistance layer 206 and the spacer layer 203.

Third Embodiment

Figure 3:
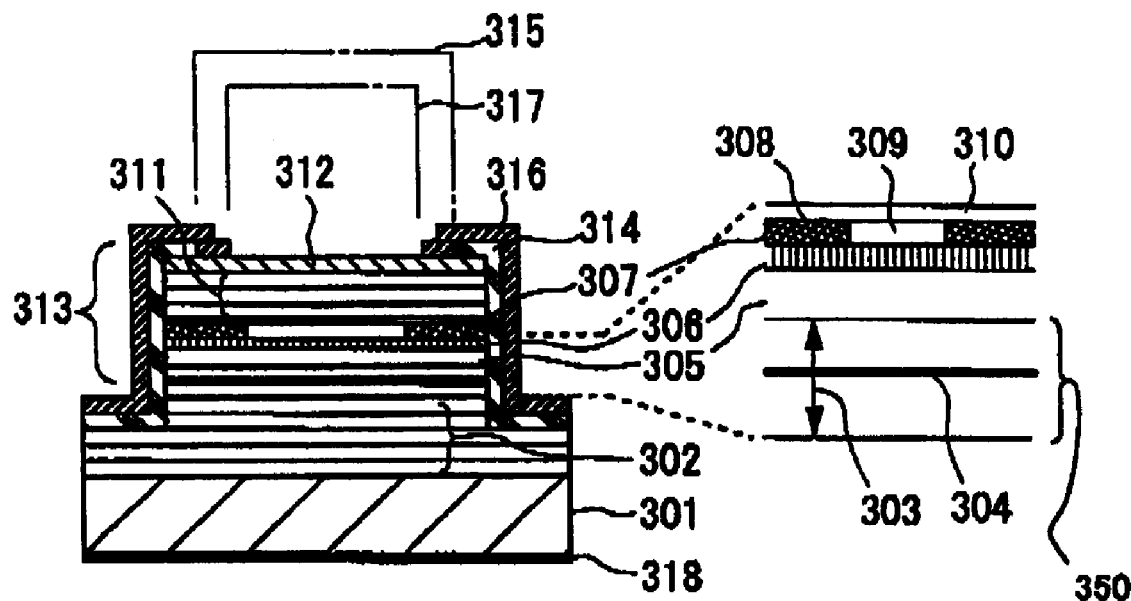
FIG. 3 shows a surface emitting semiconductor laser according to a third embodiment of the present invention.

FIG. 3 shows a VCSEL according to a third embodiment of the present invention. This embodiment has a low-resistance layer like that used in the first embodiment. The AlAs layer that is the current confining layer (oxide-confined aperture layer) is located at a middle position of the p-type DBR layer.

Referring to FIG. 3, the VCSEL has an n-type GaAs semiconductor 301 doped with Si ($Nd=1\times10^{18}$ $cm^{-3}$) on which an n-type DBR layer 302 and a spacer layer 303 are formed. The DBR layer 302 is a laminate of n-type $Al_{0.3}Ga_{0.7}As$ layers doped with Si ($Nd=1\times10^{18}$ $cm^{-3}$) and n-type $Al_{0.9}Ga_{0.1}As$ layers doped with silicon ($Nd=1\times10^{18}$ $cm^{-3}$), which layers are alternately laminated one by one to a thickness of 40.5 periods. The spacer 303 is an undoped $\lambda$ $A_{0.2}Ga_{0.8}As$ layer where $\lambda$ denotes the film thickness and its optical thickness is equal to the wavelength of laser light. A triple quantum well GaAs/$Al_{0.15}Ga_{0.85}As$ layer 304 is formed within the spacer layer 303. Layers 303 and 304 form active region 350. A DBR layer 305 is provided on the spacer layer 303. The DBR layer 305 has five periods, each of which is composed of a p-type $Al_{0.9}Ga_{0.1}As$ doped with Zn (Na=7×10$^{17}$ cm$^{-3}$) and a p-type Al$_{0.3}$Ga$_{0.7}$As doped with Zn (Na=7×10$^{17}$ cm$^{-3}$). On the DBR layer 305, there is provided a p-type Al$_{0.5}$Ga$_{0.5}$As layer 306 that is doped with Zn (Na=1.5×10$^{18}$ cm$^{-3}$) and is λ/4 thick. On the p-type layer 306, there is provided a p-type AlAs layer 307 doped with Zn (Na=7×10$^{17}$ cm$^{-3}$). On the p-type layer 307, there is provided a p-type Al$_{0.3}$Ga$_{0.7}$As layer 310 doped with Zn (Na=1.5×10$^{18}$ cm$^{-3}$). The three layers of the p-type Al$_{0.5}$Ga$_{0.5}$As layer 306, p-type AlAs layer 307, and the p-type Al$_{0.3}$Ga$_{0.7}$As layer 310 form one period of the p-type DBR layer 305. The sum of the optical thicknesses of the three layers is preferably equal to half the wavelength λ of laser light (λ/2). In order to maintain the reflection performance of the DBR layer, preferably, the sum of the optical thicknesses of the p-type AlAs layer 307 and the p-type Al$_{0.5}$Ga$_{0.5}$As layer 306, or the optical thickness of the p-type Al$_{0.5}$Ga$_{0.5}$As layer 306 is equal to a quarter of the wavelength λ of laser light (λ/4).

The p-type AlAs layer 307 is a current confining layer composed of an insulation region 308 formed by selectively oxidizing the circumferential periphery from the sidewall of the mesa, and a conductive region 309 located at the central region of the mesa. On the p-type AlAs layer 307, there is a layer 311, on which a p-type GaAs contact layer 312 is provided. The layer 311 is a laminate of p-type Al$_{0.9}$Ga$_{0.1}$As layers (Na=7×10$^{17}$ cm$^{-3}$) and p-type Al$_{0.3}$Ga$_{0.7}$As layers doped with Zn (Na 7×10$^{17}$ cm$^{-3}$), which layers are alternately laminated one by one to a thickness of 15.5 periods. On the layer 311, there is provided the p-type GaAs contact layer 312 doped with Zn (Na=1×10$^{19}$ cm$^{-3}$).

The p-type AlAs layer 307 functions as the current confining layer and simultaneously functions to control the mode of laser light in the in-film-plane as the oxide-confined aperture because of the difference in the refractive index between the insulation region 308 and the central region of the conductive region 309.

A cylindrical structure 313 called mesa or post is formed by dry etching so that the laminate is etched beyond the active layer 304 and reaches a lower layer. The post 313 is covered with an insulation film 314 made of, for example, SiNx. The insulation layer 314 has a contact hole 315, through which a p-side electrode 316 contacts a p-type contact layer 312. The p-side electrode 316 may be composed of a contact electrode that directly connects the p-type contact layer 312, and an extraction electrode that extends from the contact electrode The p-side electrode 316 has a laser emission aperture 317 from which laser light is emitted. The aperture 317 is located in the central part of the post 313. An n-side electrode 318, which may be made of a metal such as AuGeNi, is formed below the n-type GaAs substrate 301.

Fourth Embodiment

Figure 4:
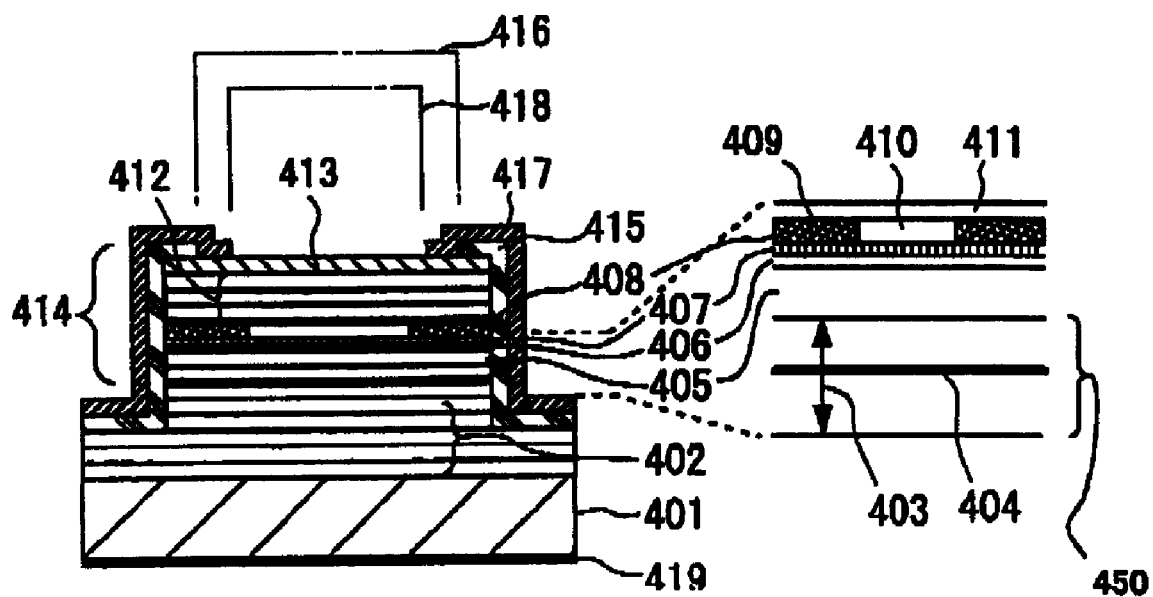
FIG. 4 shows a surface emitting semiconductor laser according to a fourth embodiment of the present invention.

FIG. 4 shows a VCSEL according to a fourth embodiment of the present invention. This VCSEL has a multilayer structure between the spacer layer and the current confining layer like the second embodiment. The position of the AlAs layer that is the current confining layer (oxide-confined aperture layer) is located at the middle position of the p-type DBR layer.

Referring to this figure, the VCSEL has an n-type GaAs semiconductor 401 doped with Si (Nd=1×10$^{18}$ cm$^{-3}$) on which an n-type DBR layer 402 and a spacer layer 403 are formed. The DBR layer 402 is a laminate of n-type Al$_{0.3}$Ga$_{0.7}$As layers doped with Si (Nd=1×10$^{18}$ cm$^{-3}$) and n-type Al$_{0.9}$Ga$_{0.1}$As layers doped with silicon (Nd=1×10$^{18}$ cm$^{-3}$), which layers are alternately laminated one by one to a thickness of 40.5 periods. The spacer 403 is an undoped λ Al$_{0.2}$Ga$_{0.8}$As layer where λ denotes the film thickness and its optical thickness is equal to the wavelength of laser light. A triple quantum well GaAs/Al$_{0.15}$Ga$_{0.85}$As layer 404 is formed within the spacer layer 403. Layers 403 and 404 form an active region 450. A DBR layer 405 is provided on the spacer layer 403. The DBR layer 405 has five periods, each of which is composes of a p-type Al$_{0.9}$Ga$_{0.1}$As doped with Zn (Na=7×10$^{17}$ cm$^{-3}$) and a p-type Al$_{0.3}$Ga$_{0.7}$As doped with Zn (Na=7×10$^{17}$ cm$^{-3}$). On the DBR layer 405, there is thick. On the p-type layer 406, there is provided a p-type Al$_{0.5}$Ga$_{0.5}$As layer 407 doped with Zn (Na=7×10$^{17}$ cm$^{-3}$). On the p-type layer 407, there is provided a p-type AlAs layer 408 on which there is provided a p-type Al$_{0.3}$Ga$_{0.7}$As layer 411 doped with Zn (Na=1.5×10$^{18}$ cm$^{-3}$). The four layers of the p-type Al$_{0.9}$Ga$_{0.1}$As layer 406, p-type Al$_{0.5}$Ga$_{0.5}$As layer 407, p-type AlAs layer 408 and the p-type Al$_{0.3}$Ga$_{0.7}$As layer 411 form one period of the p-type DBR layer. The sum of the optical thicknesses of the four layers is preferably equal to half the wavelength λ of laser light (λ/2). In order to maintain the reflection performance of the DBR layer, preferably, the sum of the optical thicknesses of the p-type AlAs layer 408 and the p-type Al$_{0.5}$Ga$_{0.5}$As layer 407, or the optical thickness of the p-type Al$_{0.5}$Ga$_{0.5}$As layer 407 is equal to a quarter of the wavelength λ of laser light (λ/4).

The p-type AlAs layer 408 is a current confining layer composed of an insulation region 409 formed by selectively oxidizing the circumferential periphery from the sidewall of the mesa, and a conductive region 410 located at the central region of the mesa. On the p-type AlAs layer 408, there is a layer 412, on which a p-type GaAs contact layer 413 doped with Zn (Na=1×10$^{19}$ cm$^{-3}$) is provided. The layer 412 is a laminate of p-type Al$_{0.9}$Ga$_{0.1}$As layers (Na=7×10$^{17}$ cm$^{-3}$) and p-type Al$_{0.3}$Ga$_{0.7}$As layers doped with Zn (Na=7×10$^{17}$ cm$^{-3}$), which layers are alternately laminated one by one to a thickness of 15.5 periods. On the layer 412, there is provided a p-type GaAs contact layer 413 doped with Zn (Na=1×10$^{19}$ cm$^{-3}$).

A post 414 is formed by dry etching so that the laminate is etched beyond the active layer 404 and reaches a lower layer. The post 414 is covered with an insulation film 415 made of, for example, SiNx. The insulation layer 415 has a contact hole 416, through which a p-side electrode 417 contacts a p-type contact layer 413. The p-side electrode 417 may be composed of a contact electrode that directly connects the p-type contact layer 413, and an extraction electrode that extends from the contact electrode. The p-side electrode 417 has a laser emission aperture 418 from which laser light is emitted. The aperture 418 is located in the central part of the post 414. An n-side electrode 419, which may be made of a metal such as AuGeNi, is formed below the n-type GaAs substrate 401.

Fifth Embodiment

Figure 5:
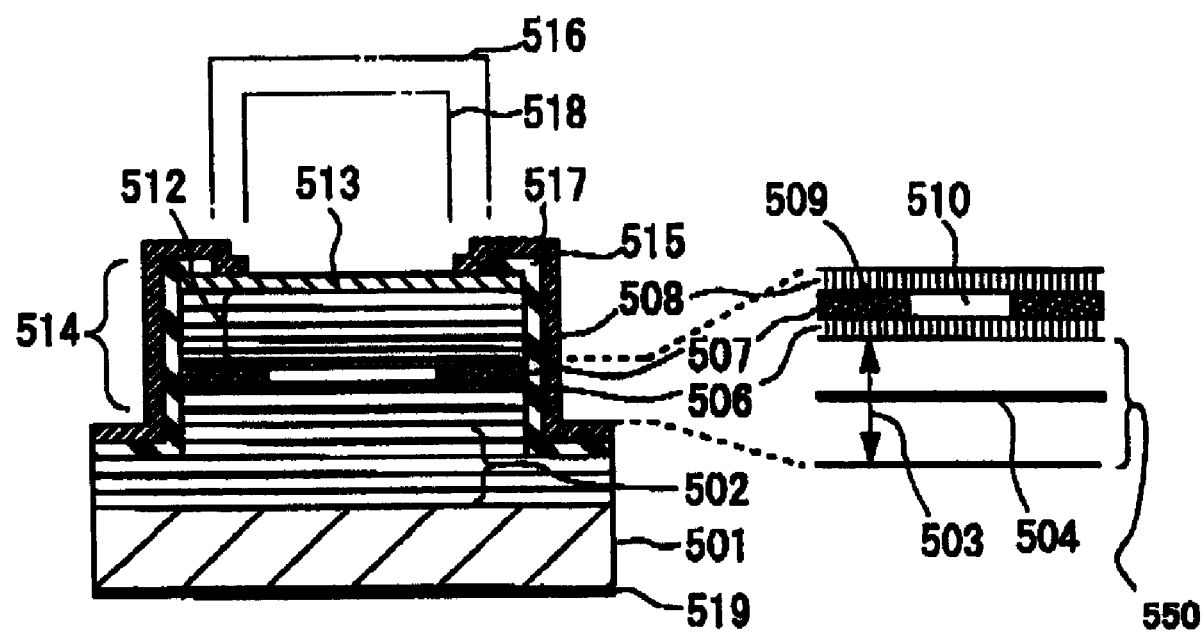
FIG. 5 shows a surface emitting semiconductor laser according to a fifth embodiment of the present invention.

FIG. 5 shows a VCSEL according to a fifth embodiment of the present invention. The first through fourth embodiments of the invention have the low-resistance layer located just below the current confining layer. In contrast, the fifth embodiment of the invention has low-resistance layers between which the current confining layer is sandwiched.

Referring to FIG. 5, the VCSEL has an n-type GaAs semiconductor 501 doped with Si (Nd=1×10$^{18}$ cm$^{-3}$) on which an n-type DBR layer 502 and a spacer 503 are formed. The DBR layer 302 is a laminate of n-type Al$_{0.3}$Ga$_{0.7}$As layers doped with Si (Nd=1×10$^{18}$ cm$^{-3}$) and n-type Al$_{0.9}$Ga$_{0.1}$As layers doped with silicon (Nd=1×10$^{18}$ cm$^{-3}$), which layers are alternately laminated one by one to a thickness of 40.5 periods. The spacer 503 is an undoped λ $Al_{0.2}Ga_{0.8}As$ layer where λ denotes the film thickness and its optical thickness is equal to the wavelength of laser light. A triple quantum well $GaAs/Al_{0.15}Ga_{0.85}As$ layer 504 is formed within the spacer layer 503. Layers 503 and 504 form an active region 550. On the spacer layer 503, there is provided a first low-resistance layer 506, which is a p-type $Al_{0.5}Ga_{0.5}As$ layer doped with Zn ($Na=1.5\times10^{18}$ $cm^{-3}$). On the first low-resistance layer 506, there is provided a p-type AlAs layer 507 doped with Zn ($Na=7\times10^{17}$ $cm^{-3}$). On the layer 507, there is provided a second low-resistance layer 508, which is a p-type $Al_{0.2}Ga_{0.8}As$ layer doped with Zn ($Na=2\times10^{18}$ $cm^{-3}$). One period of a p-type DBR layer is composed of the first low-resistance layer 506 of p-type $Al_{0.5}Ga_{0.5}As$, p-type AlAs layer 507, and the second low-resistance layer 508 of p-type $Al_{0.2}Ga_{0.8}As$. The sum of the optical thicknesses of the three layers is preferably equal to half the wavelength λ of laser light (λ/2). In order to maintain the reflection performance of the DBR layer, preferably, the sum of the optical thicknesses of the p-type AlAs layer 507 and the p-type $Al_{0.5}Ga_{0.5}As$ layer 506, or the optical thickness of the p-type $Al_{0.5}Ga_{0.5}As$ layer 506 is equal to a quarter of the wavelength λ of laser light (λ/4). On the p-type $Al_{0.2}Ga_{0.8}As$ layer 508, a DBR layer 512 of p-type $Al_{0.9}Ga_{0.1}As$ layers doped with Zn ($Na=7\times10^{17}$ $cm^{-3}$) and p-type $Al_{0.3}Ga_{0.7}As$ layers doped with Zn ($Na=7\times10^{17}$ $cm^{-3}$), which layers are alternately laminated one by one to a thickness of 20.5 periods. A p-type GaAs contact layer 513 doped with Zn ($Na=1\times10^{19}$ $cm^{-3}$) is formed on the p-type DBR layer 512. The Al composition ratio of the layer of the first period of the p-type DBR layer is lower than that of the subsequent layers of the p-type DBR layer located above the p-type AlAs layer 507.

The p-type AlAs layer 507 functions as the current confining layer and simultaneously functions to control the mode of laser light in the in-film-plane as the oxide-confined aperture because of the difference in the refractive index between the insulation region 509 and the central region of the conductive region 510.

A post 514 is covered with an insulation film 515 made of, for example, SiNx. The insulation layer 515 has a contact hole 516, through which a p-side electrode 517 contacts a p-type contact layer 513. The p-side electrode 517 may be composed of a contact electrode that directly connects the p-type contact layer 513, and an extraction electrode that extends from the contact electrode. The p-side electrode 517 has a laser emission aperture 518 from which laser light is emitted. The aperture 518 is located in the central part of the post 514. An n-side electrode 519, which may be made of a metal such as AuGeNi, is formed below the n-type GaAs substrate 501.

Figure 6A:
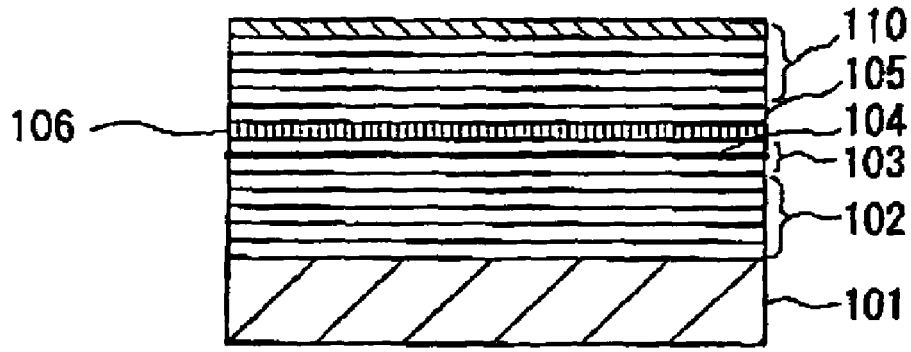
FIGS. 6A, 6B and 6C show a first group steps of a process of fabricating the surface emitting semiconductor laser according to the first embodiment of the present invention.

A description will now be given, with reference to FIGS. 6A–6C, 7D–7F and 8G–8i, of a method of fabricating the VCSEL according to the first embodiment of the present invention. As shown in FIG. 6A, the following semiconductor layers are in turn formed on the (100) plane of the semi-insulating GaAs substrate 101 by MOCVD (Metalorganic Chemical Vapor Deposition): the lower DBR layer 102 that is a laminate of n-type $Al_{0.3}Ga_{0.7}As$ layers and n-type $Al_{0.9}Ga_{0.1}As$ layers alternately laminated one by one to a thickness of 40.5 periods; the spacer layer 103 that is the undoped λ $Al_{0.4}Ga_{0.6}As$ layer and includes the triple quantum well of $GaAs/Al_{0.15}Ga_{0.85}As$ (active layer); the p-type $Al_{0.5}Ga_{0.5}As$ layer 106, the p-type AlAs layer (current confining layer) 105; and the upper DBR layer 110 of p-type $Al_{0.9}Ga_{0.1}As/Al_{0.3}Ga_{0.7}As$ including the p-type $Al_{0.3}Ga_{0.7}As$ layer 107 and the p-type GaAs contact layer 111.

Figure 6B:
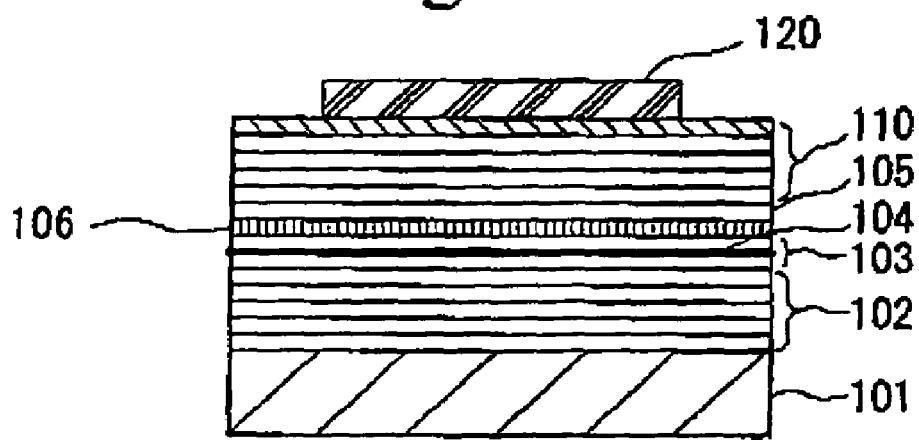
Figure 6C:
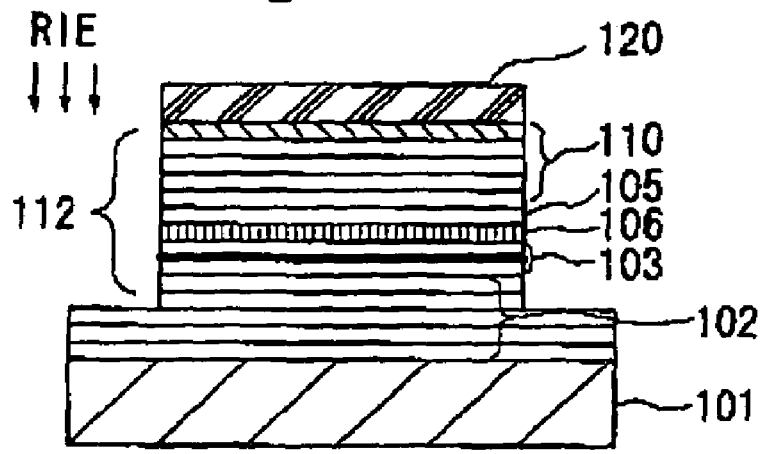

The laser substrate is removed from the growth chamber. Then, as shown in FIG. 6B, a mask pattern 102 of $SiO_2$ is formed on the substrate by the photolithography process, and etching is performed. This results in the post or mesa 112 like a rectangular column as shown in FIG. 6C. The upper DBR layer 110, the AlAs layer 105, the spacer layer 103 and part of the lower DBR layer 102 are removed by RIE (Reactive Ion Etching). The post may have a cylindrical shape instead of the rectangular column shape.

Figure 7D:
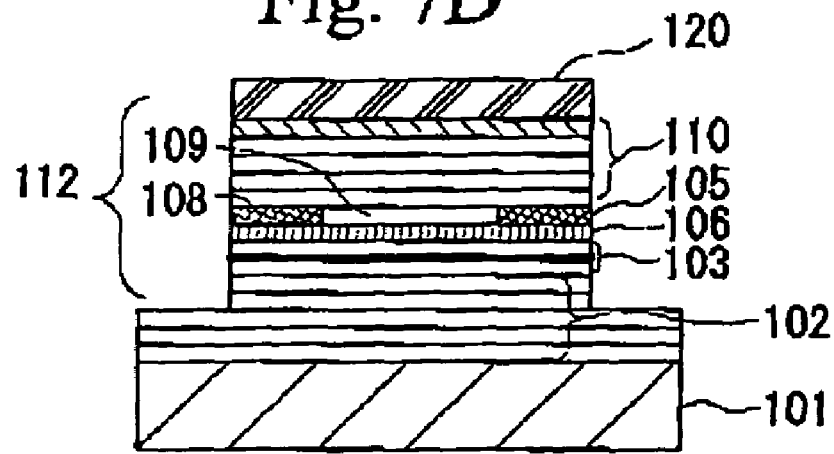
FIGS. 7D, 7E and 7F show a second group of steps of the process of fabricating the surface emitting semiconductor laser according to the first embodiment of the present invention.

The definition of the post 112 exposes the side surface of the AlAs layer 105. The laser substrate is exposed to a steam atmosphere at 350° C. for 30 minutes with nitrogen being used as a carrier gas (at a flow rate of 2 liter per minute). The AlAs layer 105 has an oxidization rate that is extremely faster than that for the $Al_{0.9}Ga_{0.1}As$ layer or $Al_{0.3}Ga_{0.7}As$ layer that forms the other reflection film. As shown in FIG. 7D, oxidizing of the AlAs layer 105 starts from the side surface of the post, and the oxidized region 108 that reflects the shape of the post is finally formed. The oxidized region 108 of the AlAs layer 105 has reduced conductivity, and the remaining central region 109 of the AlAs layer 105 has well-conductivity, then which makes the current confining function in VCSEL. The oxidized region 108 has a refractive index value (~1.6) approximately equal to half the refractive index values of the remaining central region 109. Thus, the AlAs layer 105 including both the oxidized region 108 and the remaining central region 109 also functions as a light-confining layer.

Figure 7E:
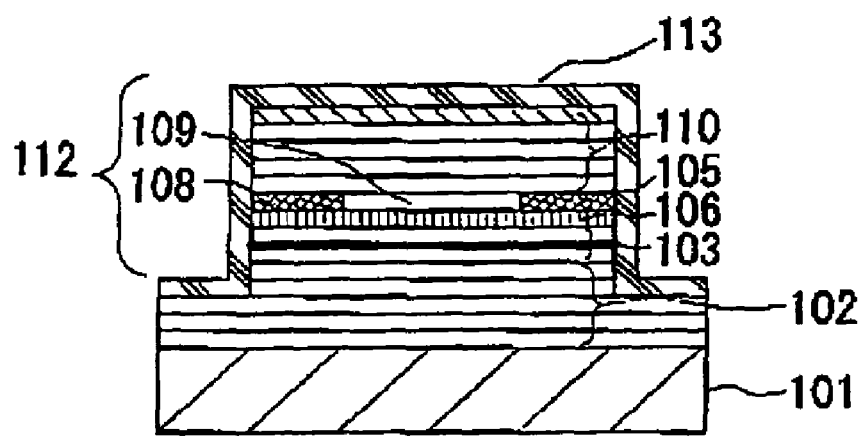
Figure 7F:
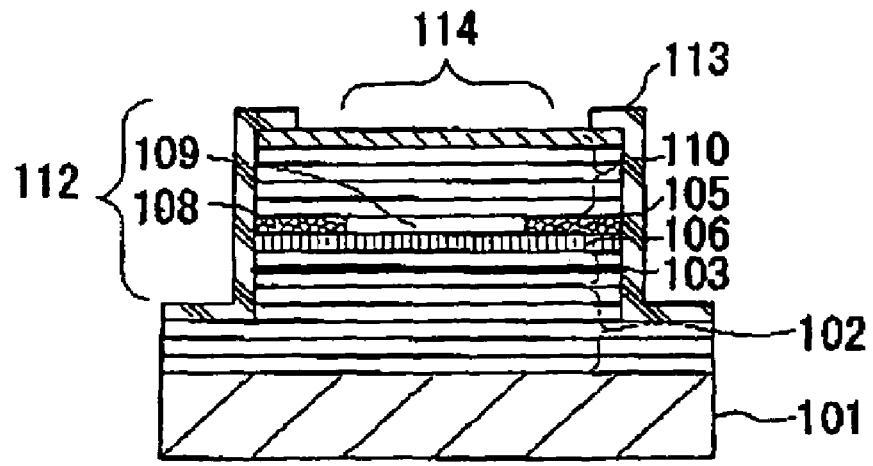

Then, as shown in FIG. 7E, the mask 120 is removed and the insulation film 113 of SiNx or the like is provided on the upper surface of the substrate including the exposed side surface of the post. Then, as shown in FIG. 7F, the contact hole 114 is formed on the top of the post, so that the interlayer insulation film 113 is defined.

Figure 8G:
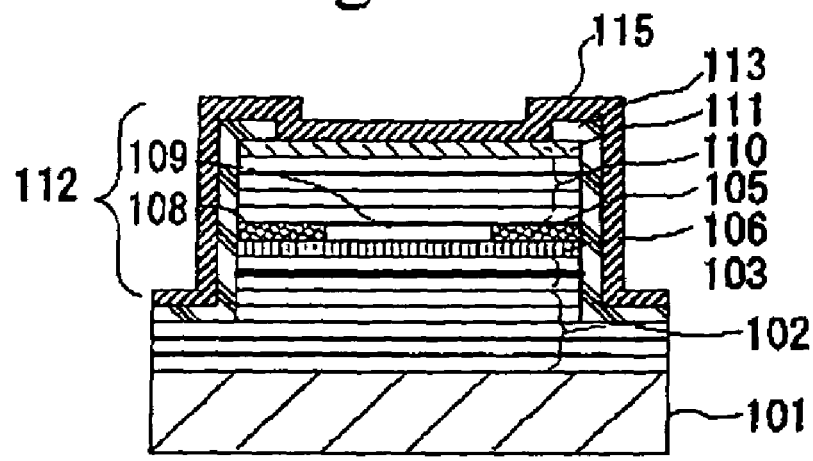
FIGS. 8G, 8H and 8I show a third group of steps of the process of fabricating the surface emitting semiconductor laser according to the first embodiment of the present invention.
Figure 8H:
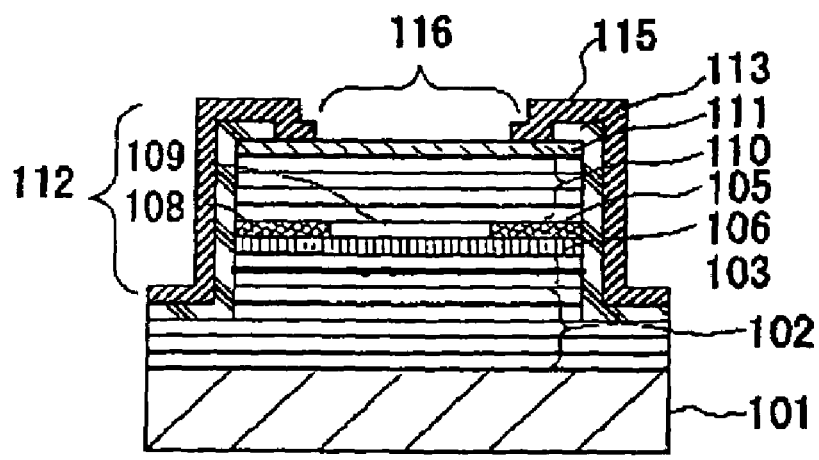
Figure 8I:
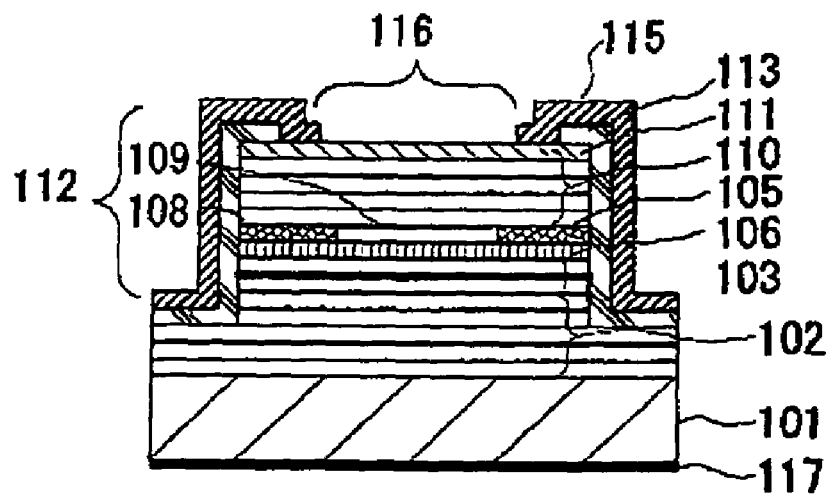
Figure 9:
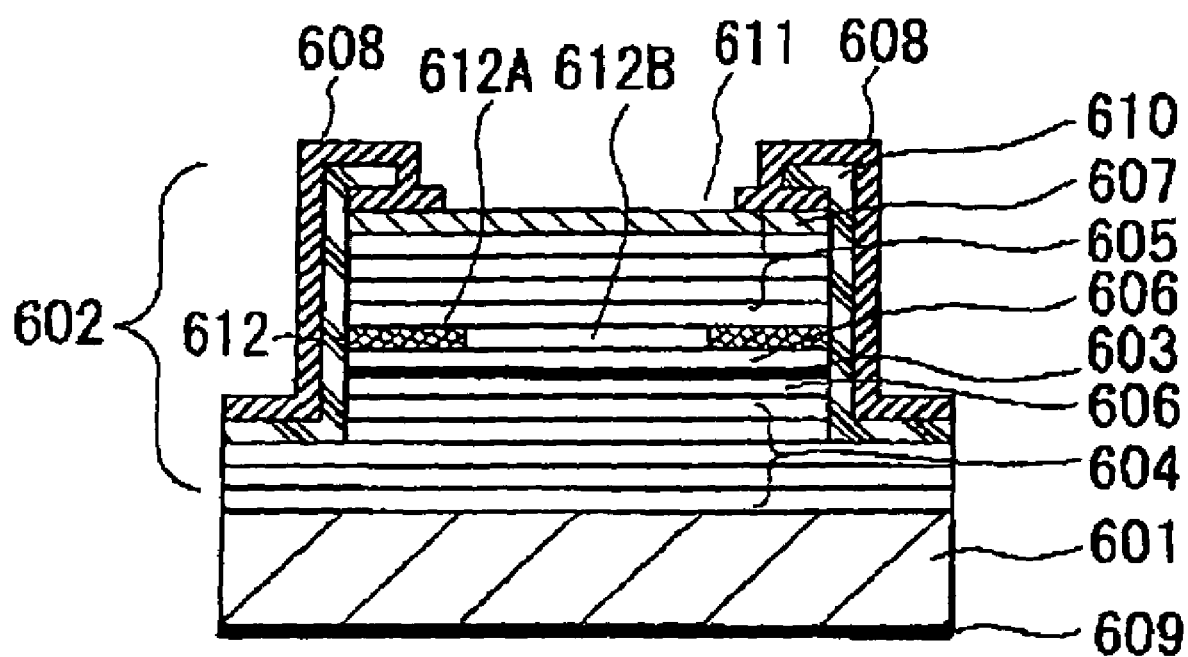
FIG. 9 shows a conventional surface emitting semiconductor laser.
Figure 10A:
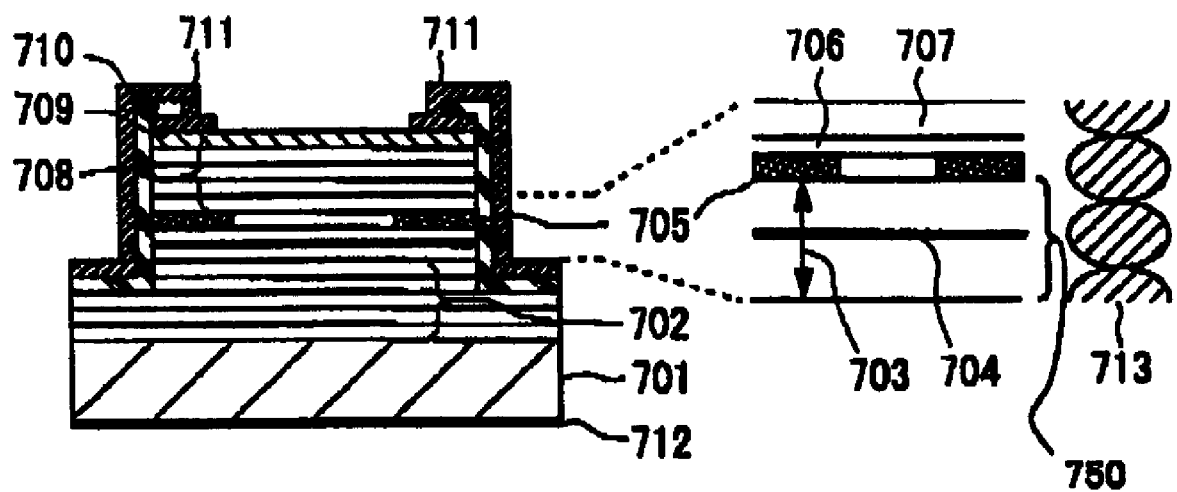
FIGS. 10A and 10B show another conventional surface emitting semiconductor laser.
Figure 10B:
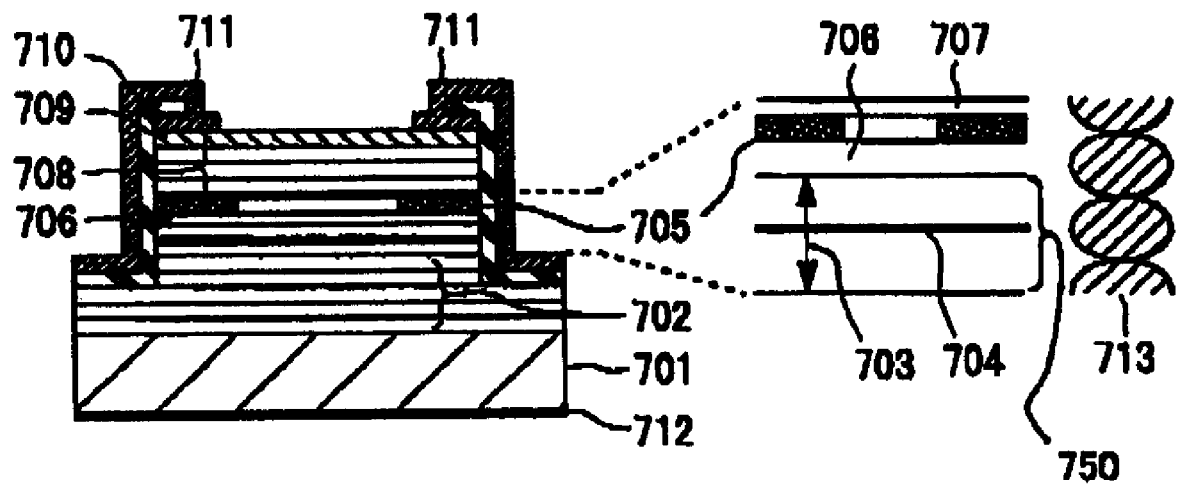

Subsequently, as is shown in FIG. 8G, the electrode layer 115 is formed on the entire surface of the substrate including the post 112 and is then patterned, as shown in FIG. 8H. The electrode layer 115 has the emission aperture 116 at the center thereof, and extends up to, for example, an electrode pad (not shown) on the bottom of the post 112. The extended electrode serves as the p-side electrode. As shown in FIG. 8I, the n-side electrode 117 is formed on the backside of the substrate 101. In the above-mentioned manner, VCSEL is formed.

The methods of fabricating the VCSELs of the second through fourth embodiments are basically the same as those of the VCSEL of the first embodiment except the positions and number of the low-resistance layers and the positions of the current confining layers.

The embodiments mentioned above use the AlAs current confining layer. Alternatively, an AlGaAs layer that has a high Al composition ratio such as $Al_{0.98}Ga_{0.12}As$ may be used to form the current confining layer. A buffer layer that buffers the gap in the band structure between the current confining layer and the low-resistance layer may be used. The low-resistance layer may be formed by multiple low-resistance layers. In this case, the layers may have the same or different Al composition ratios.

The n-side electrode is not limited to the backside of the n-type GaAs substrate, but may be formed on the same side as the p-side electrode. For example, a second post like the post for laser oscillation is formed on the substrate, and the n-side electrode is formed on the top of the second post. The n-side electrode is connected to the n-type lower multilayer reflection film 102 via a contact hole formed on the bottom of the post. Another means without the second post may be employed. More specifically, a pad for the n-side electrode is formed on the bottom of the post and makes an intracavity connection with the lower multilayer reflection film 102.

The first through fourth embodiments employ AlGaAs-based materials that enable the wavelength range of 700 to 900 nm. The present invention includes a VCSEL that contains N substituted for As and an InGaN active layer and enables the wavelength range of 400 to 500 nm. The InGaN-based VCSEL provides the same effects as those of the AlGaAs-based VCSEL.

The present invention includes VCSEL, particularly, a type of VCSEL that confines current by the current confining layer having the selectively oxidized region in which the low-resistance layer that has a relatively low Al composition ratio and a relatively high carrier density below the current confining layer in which the current path is narrowed. With this structure, the high resistance generated just below the current confining layer can be reduced. The layer just below the current confining layer is the layer that contains a high Al composition ratio and is one of the layers forming the DBR layer particularly in the vertical cavity or resonator of VCSEL in which the current confining layer is provided at the node of the standing wave of laser light in order to maintain the single mode up to the high power range and stabilize the mode. When the present invention is applied to VCSEL with the above structure, the remarkable effects can be obtained. The device with the reduced resistance is capable of operating at a higher speed and is highly reliable because degradation due to Joule heat in the vicinity of the active layer can be restrained.

As described above, the present invention includes the surface emitting semiconductor laser that includes: a semiconductor substrate; a first semiconductor multilayer reflection film of a first conduction type on the semiconductor substrate; a second semiconductor multilayer reflection film of a second conduction type; an active region and a current confining layer interposed between the first and second semiconductor multilayer reflection films; and a low-resistance layer interposed between the current confining layer and the active region. The low-resistance layer provided between the current confining layer and the active region reduces the resistance of the pass from the current confining layer to the active region and increases the driving speed. This results in improvements in the high-frequency response.

The present invention also includes the surface emitting semiconductor laser that includes: a semiconductor substrate; a first semiconductor multilayer reflection film of a first conduction type on the semiconductor substrate; a second semiconductor multilayer reflection film of a second conduction type; an active region disposed between the first and second semiconductor multilayer reflection films; a current confining layer in the second semiconductor multilayer reflection film; and a low-resistance layer interposed between the current confining layer and the active region. The current confining layer is formed in the semiconductor multilayer reflection film, the current confining layer is away from the active region. Thus, the laser is capable of operating at high speed and delaying of propagation of deformation and transition likely to occur at the joining interface with the active region. This elongates the lifetime of the current confining layer.

Preferably, the active region comprises an active layer and a spacer layer in which the active layer is provided, and the low-resistance layer is provided between the current confining layer and the spacer layer. It is possible to reduce the resistance that current narrowed down by the current confining layer receives directly due to the undoped spacer layer. This increases the operating speed.

Preferably, the first and second semiconductor multilayer reflection films are DBR mirrors, each of which is a laminate of different AlGaAs layers of different composition ratios alternately deposited to a thickness of a given number of periods. The current confining layer includes AlAs and an oxidized region defined by oxidizing a part of a semiconductor layer such as an AlGaAs layer having a high Al composition ratio with this structure, current and light are confined.

Preferably, the low-resistance layer contains $Al_xGa_{1-x}As$, the second semiconductor multilayer reflection film comprises $Al_aGa_{1-a}As$ and $Al_bGa_{1-b}As$, and composition ratios a, b and x meet a>x>b. When the spacer layer contains $Al_cGa_{1-c}As$, the composition ratios a, b, c and x meet a>x>b and x>c. Mobility of carrier can be enhanced by setting the Al composition of the low-resistance layer lower than the high Al composition ratio of the second semiconductor multilayer reflection film. In addition, the impurity-activated ratio can be improved and the carrier density of the low-resistance layer may be higher than that of the second semiconductor reflection film. As a result, the low-resistance layer can be realized. Degradation of the reflectance of light can be restrained by setting the Al composition of the low-resistance layer greater than the low Al composition ratio of the second semiconductor multilayer film.

Preferably, the product of d1 and n1 or the sum of the product d1 and n1 and the product of d2 and n2 is approximately equal to a quarter of $\lambda$ where d1 and n1 respectively denote a thickness and a refractive index of the low-resistance layer, d2 and n2 respectively denote a thickness and a refractive index of the central conductive region of the current confining layer, and $\lambda$ is a wavelength of laser light emitted.

The present invention includes the surface emitting semiconductor laser comprising: a semiconductor substrate; a first semiconductor multilayer reflection film of a first conduction type; an active region; a current confining layer formed by oxidizing a part of a high-Al-composition-ratio layer having at least single layer; a second semiconductor multilayer reflection film of, a second conduction type; and a low-resistance layer provided in the vicinity of the current confining layer and comprising $Al_xGa_{1-x}As$, the second semiconductor multilayer reflection film comprising $Al_aGa_{1-a}As$ and $Al_bGa_{1-b}As$, composition ratios a, b and x meet a>x>b.

Although a few preferred embodiments of the present invention have been shown and described, it would be appreciated by those skilled in the art that changes may be made in these embodiments without departing from the principles and spirit of the invention, the scope of which is defined in the claims and their equivalents.

The entire disclosure of Japanese Patent Application No. 2003-12697 field on Apr. 25, 2003 including the specification, claims, drawings and abstract is incorporated therein by reference in its entity.

What is claimed is:

1. A surface emitting semiconductor laser comprising:
   a semiconductor substrate;
   a first semiconductor multilayer reflection film of a first conduction type on the semiconductor substrate;
   a second semiconductor multilayer reflection film of a second conduction type;

an active region and a current confining layer interposed between the first and second semiconductor multilayer reflection films; and a low-resistance layer interposed between the current confining layer and the active region.

2. The surface emitting semiconductor laser as claimed in claim 1, wherein:

the active region comprises an active layer and a spacer layer in which the active layer is provided; and the low-resistance layer is provided between the current confining layer and the spacer layer.

3. The surface emitting semiconductor laser as claimed in claim 1, wherein:

the low-resistance layer comprises $Al_xGa_{1-x}As$;

the second semiconductor multilayer reflection film comprises $Al_aGa_{1-a}As$ and $Al_bGa_{1-b}As$; and composition ratios a, b and x meet a>x>b.

4. The surface emitting semiconductor laser as claimed in claim 2, wherein:

the spacer layer comprises $Al_cGa_{1-c}As$; and composition ratios a, b, c and x meet a>x>b and x>c.

5. The surface emitting semiconductor laser as claimed in claim 1, wherein a product of d1 and n1 or a sum of a product d1 and n1 and a product of d2 and n2 is approximately equal to a quarter of λ where d1 and n1 respectively denote a thickness and a refractive index of the low-resistance layer, d2 and n2 respectively denote a thickness and a refractive index of the central conductive region of the current confining layer, and λ is a wavelength of laser light emitted.

6. The surface emitting semiconductor laser as claimed in claim 1, wherein the low-resistance layer has a carrier density higher than that of the second semiconductor multilayer reflection film.

7. The surface emitting semiconductor laser as claimed in claim 1, wherein the low-resistance layer comprises a laminate of semiconductor layers.

8. A surface emitting semiconductor laser comprising:

a semiconductor substrate;

a first semiconductor multilayer reflection film of a first conduction type on the semiconductor substrate;

a second semiconductor multilayer reflection film of a second conduction type;

an active region disposed between the first and second semiconductor multilayer reflection films;

a current confining layer in the second semiconductor multilayer reflection film; and a low-resistance layer interposed between the current confining layer and the active region.

9. The surface emitting semiconductor laser as claimed in claim 8, wherein:

the active region comprises an active layer and a spacer layer in which the active layer is provided; and the low-resistance layer is provided between the current confining layer and the spacer layer.

10. The surface emitting semiconductor laser as claimed in claim 8, wherein:

the low-resistance layer comprises $Al_xGa_{1-x}As$;

the second semiconductor multilayer reflection film comprises $Al_aGa_{1-a}As$ and $Al_bGa_{1-b}As$; and composition ratios a, b and x meet a>x>b.

11. The surface emitting semiconductor laser as claimed in claim 9, wherein:

the spacer layer comprises $Al_cGa_{1-c}As$; and composition ratios a, b, c and x meet a>x>b and x>c.

12. The surface emitting semiconductor laser as claimed in claim 8, wherein a product of d1 and n1 or a sum of a product d1 and n1 and a product of d2 and n2 is approximately equal to a quarter of λ where d1 and n1 respectively denote a thickness and a refractive index of the low-resistance layer, d2 and n2 respectively denote a thickness and a refractive index of the central conductive region of the current confining layer, and λ is a wavelength of laser light emitted.

13. The surface emitting semiconductor laser as claimed in claim 8, wherein the low-resistance layer has a carrier density higher than that of the second semiconductor multilayer reflection film.

14. The surface emitting semiconductor laser as claimed in claim 8, wherein the low-resistance layer comprises a laminate of semiconductor layers.

15. A surface emitting semiconductor laser comprising:

a semiconductor substrate;

a first semiconductor multilayer reflection film of a first conduction type;

an active region:

a current confining layer formed by oxidizing a part of a high-Al-composition-ratio layer having at least single layer;

a second semiconductor multilayer reflection film of a second conduction type; and a low-resistance layer provided in the vicinity of the current confining layer and comprising $Al_xGa_{1-x}As$, the second semiconductor multilayer reflection film comprising $Al_aGa_{1-a}As$ and $Al_bGa_{1-b}As$, composition ratios a, b and x meet a>x>b.

16. The surface emitting semiconductor laser as claimed in claim 15, wherein the low-resistance layer is provided so that the current confining layer is provided therein.

17. A method of fabricating a surface emitting semiconductor laser comprising the steps of:

forming a semiconductor laminate on a semiconductor substrate, the semiconductor laminate including a first semiconductor multilayer reflection film of a first conduction type, an active region, a low-resistance layer, a high-Al-composition-ratio semiconductor layer containing a high Al composition ratio, and a second semiconductor multilayer reflection film of a second conduction type;

etching the semiconductor laminate so that a mesa structure is formed on the semiconductor substrate; and forming a current confining layer by oxidizing a part of the high-Al-composition-ratio layer from a side surface of the mesa structure to thus form the current confining layer.

18. The method as claimed in claim 17, wherein the low-resistance layer comprises $Al_xGa_{1-x}As$;

the second semiconductor multilayer reflection film comprises $Al_aGa_{1-a}As$ and $Al_bGa_{1-b}As$; and composition ratios a, b and x meet a>x>b.

19. The method as claimed in claim 18, wherein the active region comprises spacer layers between which an active layer is sandwiched;

the spacer layers comprise $Al_cGa_{1-c}As$; and composition ratios a, b, c and x meet a>x>b and x>c.

20. A method of fabricating a surface emitting semiconductor laser comprising the steps of:

forming a semiconductor laminate on a semiconductor substrate, the semiconductor laminate including a first semiconductor multilayer reflection film of a first conduction type, an active region, a high-Al-composition-ratio semiconductor layer containing a high Al composition ratio, low-resistance layers between which the high-Al-composition-ratio semiconductor layer is sandwiched, and a second semiconductor multilayer reflection film of a second conduction type;

etching the semiconductor laminate so that a mesa structure is formed on the semiconductor substrate; and forming a current confining layer by oxidizing a part of the high-Al-composition-ratio layer from a side surface of the mesa structure to thus form the current confining layer.

21. The method as claimed in claim 20, wherein the low-resistance layer comprises $Al_xGa_{1-x}As$;

the second semiconductor multilayer reflection film comprises $Al_aGa_{1-a}As$ and $Al_bGa_{1-b}As$; and composition ratios a, b and x meet a>x>b.

22. The method as claimed in claim 21, wherein the active region comprises spacer layers between which an active layer is sandwiched;

the spacer layers comprise $Al_cGa_{1-c}As$; and composition ratios a, b, c and x meet a>x>b and x>c.

* * * * *